(12) United States Patent   (10) Patent No.: US 8,765,540 B2
Yin et al.   (45) Date of Patent: Jul. 1, 2014

(54) SEMICONDUCTOR STRUCTURE AND METHOD FOR MANUFACTURING THE SAME

(75) Inventors: Haizhou Yin, Poughkeepsie, NY (US); Huilong Zhu, Poughkeepsie, NY (US); Zhijiong Luo, Poughkeepsie, NY (US)

(73) Assignee: The Institute of Microelectronics Chinese Academy of Science, Beijing ( * ) Notice: Subject to any disclaimer, the term of this patent is extended or adjusted under 35 U.S.C. 154(b) by 0 days.

(21) Appl. No.: 13/697,072

(22) PCT Filed: May 16, 2012

(86) PCT No.: PCT/CN2012/000669
§ 371 (c)(1),
(2), (4) Date: Nov. 9, 2012

(87) PCT Pub. No.: WO2012/174850
PCT Pub. Date: Dec. 27, 2012

(65) Prior Publication Data
US 2013/0193490 A1    Aug. 1, 2013

(30) Foreign Application Priority Data
Jun. 20, 2011  (CN) .......................... 2011 1 0166632

(51) Int. Cl.
*H01L 27/092* (2006.01)
*H01L 29/66* (2006.01)
(52) U.S. Cl.
USPC ........... 438/198; 438/299; 438/285; 257/255; 257/288; 257/E29.242; 257/E21.409
(58) Field of Classification Search
CPC ............ H01L 27/228; H01L 29/41766; H01L 29/772; H01L 27/14614; H01L 29/0878; H01L 29/66; H01L 29/66628
USPC .................. 257/255, 288, E29.242, E21.409; 438/198, 299, 285
See application file for complete search history.

(56) References Cited

U.S. PATENT DOCUMENTS

2007/0085131 A1* 4/2007 Matsuo et al. ................ 257/315
2012/0094456 A1* 4/2012 Wang et al. .................... 438/285

FOREIGN PATENT DOCUMENTS

| CN | 1307696 C | 3/2007 |
| CN | 101288180 A | 10/2008 |
| JP | 2003298047 A | 10/2003 |
| JP | 2006210551 A | 10/2006 |

OTHER PUBLICATIONS

"Silicon-on-Nothing—an Innovative Process for Advanced CMOS" IEEE Transactions on Electron Devices, vol. 147, No. 11, 2000, Malgorzata Jurcazak, Thomas Skotnicki, M. Paoli, et. al.

* cited by examiner

*Primary Examiner* — Cathy N Lam

(57) ABSTRACT

The present invention provides a semiconductor structure, which comprises: a substrate, a semiconductor base, a semiconductor auxiliary base layer, a cavity, a gate stack, a sidewall spacer, and a source/drain region, wherein the gate stack is located on the semiconductor base; the sidewall spacer is located on the sidewalls of the gate stack; the source/drain region is embedded in the semiconductor base and is located on both sides of the gate stack; the cavity is embedded in the substrate; the semiconductor base is suspended above the cavity, the thickness of the middle portion of the semiconductor base is greater than the thickness of the two end portions of the semiconductor base in the direction of the length of the gate, and the two end portions of the semiconductor base are connected to the substrate in the direction of the width of the gate; and the semiconductor auxiliary base layer is located on the sidewall of the semiconductor base and has an opposite doping type to that of the source/drain region, and the doping concentration of the semiconductor auxiliary base layer is higher than that of the semiconductor base. Correspondingly, the present invention also provides a method for manufacturing a semiconductor structure. According to the present invention, the short channel effect can be suppressed, and the device performance can be improved, thereby reducing the cost and simplifying the process.

10 Claims, 5 Drawing Sheets

SEMICONDUCTOR STRUCTURE AND METHOD FOR MANUFACTURING THE SAME

CROSS-REFERENCE TO RELATED APPLICATION

This application is a National Stage application of, and claims priority to, PCT Application No. PCT/CN2012/000669, filed on May 16, 2012, entitled "Semiconductor Structure and Method for Manufacturing the same", which claimed priority to Chinese Application No. 201110166632.1, filed on Jun. 20, 2011. Both the PCT Application and Chinese Application are incorporated herein by reference in their entireties.

FIELD OF THE INVENTION

The present invention relates to the field of semiconductor fabrication, and in particular, to a semiconductor structure and a method for manufacturing the same.

BACKGROUND OF THE INVENTION

In order to increase the performance and integration level of integrated circuit chips, the feature size of devices are continuously reducing according to the Moore's Law, and has now been reduced to a nanometer scale. With the reduction in the device volume, the power consumption and leak current has become the biggest concern, and a series of effects that could be ignored in the MOSFET long channel model become more and more notable and even become dominant factors affecting the performance. Such phenomena are collectively called the short channel effect. The short channel effect may cause the degradation of the electrical properties of the device, for example, a drop in the gate threshold voltage, an increase in power consumption and a reduction in signal-to-noise ratio, etc.

In order to alleviate the short channel effect, a Super Steep Retrograde Well (SSRW) is introduced into the semiconductor field effect device. The Super Steep Retrograde Well has a low-high-low (or low-high) doping profile of the channel, the surface area of the channel maintains a low doping concentration, while a highly-doped area is formed in the area under the channel surface by an appropriate method, such as ion implantation, thus reducing the width of the depletion layer of the source/drain region and avoiding the short channel effects, such as an increased leak current caused due to source-drain punch-through, an increase in the threshold voltage and the like.

As for the MOS transistor structure, the Silicon on Insulator (SOI) structure has become a preferred structure for MOS devices of a deep sub-micron and nanometer level because it can well suppress the short channel effect and can enhance the capability of scaling down of the devices.

With the continuous development of the SOI technique, in a prior art document titled "Silicon-on-Nothing—an Innovative Process for Advanced CMOS" (IEEE Transactions on Electron Devices, Vol. 147, No. 11, 2000), Malgorzata Jurcazak, Thomas Skotnicki, M. Paoli, et. al. proposes a novel SOI device-SON (Silicon on Nothing) device structure in which a channel region is formed on a cavity.

SON (Silicon on Nothing) is an advanced technique developed by CEA-Leti in France and STMicroelectronics for the processing procedure of CMOS of a technical node of 90 nm and smaller, in which SON forms a local area Silicon on Insulator under the channel by means of a "cavity" structure, and the cavity may be an air gap or an oxide filling. Compared to the SOI device, the dielectric constant of the cavity structure is significantly reduced, thereby greatly reducing the influence from the two-dimensional electric field effect of a buried oxide layer and thus the DIBL effect. Moreover, good short channel properties and a more steep sub-threshold slope can be obtained by controlling the silicon film thickness and the cavity height, meanwhile, the self-heating effect of the SOI device can be alleviated. Bulk silicon may be used to replace the more expensive SOI wafer as the original wafer, so SON is considered as a preferred structure for replacing the SOI technique.

The most critical issue in the preparation of a SON device is how to prepare a cavity layer. At the time when the SON structure was first proposed, an epitaxial SiGe sacrifice layer technique was used. Afterwards, there are documents that provide methods for preparing the SON device by helium (He) ion implantation together with additional annealing or joint implantation of hydrogen-helium (H—He) ions together with additional annealing. The epitaxial SiGe sacrifice layer technique increases the process steps for manufacturing the device and increases the process complexity at the same time. With the reduction in the feature size of the device, requirements on the depth of the super-shallow junction of the device also makes ion implantation a difficult problem, so there are still many challenges to be overcome before actually applying the existing technique to the current manufacturing process for the very large scale integrated circuits.

Moreover, there are also many difficult technical problems concerning how to use the super steep retrograde well in the SON device to further suppress the short channel effect and improve the device performance.

SUMMARY OF THE INVENTION

An object of the present invention is to overcome at least the above-mentioned technical defects, and to provide a semiconductor device structure and a method for manufacturing the same, which can reduce the cost and simplify the process steps, and which can alleviate the short channel effect and improve the semiconductor device performance in conjunction with the super steep retrograde well technique.

In order to achieve the above object, the present invention provides a semiconductor structure, which comprises: a substrate, a semiconductor base, a semiconductor auxiliary base layer, a cavity, a gate stack, a sidewall spacer, and a source/drain region, wherein the gate stack is located on the semiconductor base;

the sidewall spacer is located on the sidewalls of the gate stack;

the source/drain region is embedded in the semiconductor base and is located on both sides of the gate stack;

the cavity is embedded in the substrate;

the semiconductor base is suspended above the cavity, the thickness of the middle portion of the semiconductor base is greater than the thickness of the two end portions of the semiconductor base in the direction of the length of the gate, and the two end portions of the semiconductor base are connected to the substrate in the direction of the width of the gate; and the semiconductor auxiliary base layer is located on the sidewall of the semiconductor base and has an opposite doping type to that of the source/drain region, and the doping concentration of the semiconductor auxiliary base layer is higher than that of the semiconductor base.

Preferably, the doping concentration of the semiconductor auxiliary base layer may be about $5\times10^{18}$-$5\times10^{-19}$ cm$^{-3}$, and the thickness of the semiconductor auxiliary base may be about 10-20 nm. With respect to a PMOS device, the doping type of the semiconductor auxiliary base layer is an N type; and with respect to a NMOS device, the doping type of the semiconductor auxiliary base layer is a P type.

Correspondingly, the present invention also provides a method for manufacturing a semiconductor structure, comprising:

(a) providing a substrate, forming a gate stack on the substrate, and forming a sidewall spacer on the sidewalls of the gate stack;

(b) forming grooves on the substrate on both sides of the gate stack, wet etching the grooves on both sides of the gate stack to penetrate through to form a cavity, wherein a semiconductor base is formed of the part of the substrate being suspended above the cavity;

(c) forming a semiconductor auxiliary base layer on the sidewall of the semiconductor base; and (d) forming a source/drain region.

Preferably, forming the grooves further comprises:

forming a mask layer on the substrate and the gate stack;

covering the mask layer with a layer of photoresist and forming openings on the photoresist by the exposure and development, wherein said openings are located on both sides of the gate stack;

etching the mask layer in said openings and removing the photoresist; and etching the substrate to form grooves on both sides of the gate stack.

In the semiconductor structure and the method for manufacturing the same according to the present invention, a SON (Silicon-on-Nothing) device structure can be made on a common wafer using the conventional semiconductor etching technique, which greatly simplifies the process, reduces the cost and increases the efficiency. Meanwhile, the short channel effect is suppressed and the semiconductor device performance is further improved by forming a super steep retrograde well in the semiconductor device.

BRIEF DESCRIPTION OF THE DRAWINGS

The above and/or additional aspects and advantages of the present invention will become apparent and easily understood from the following description of the embodiments in conjunction with the accompanying drawings, in which.

DETAILED DESCRIPTION OF THE PREFERRED EMBODIMENTS

The embodiments of the present invention will be described in detail below, and examples of the embodiments are shown in the figures. Throughout the drawings, the same or similar reference numbers represent the same or similar elements or elements having the same or similar functions. The embodiments described below with reference to the drawings are exemplary, which are only for illustrating the present invention instead of limiting the present invention. The following disclosure provides a plurality of different embodiments or examples to achieve different structures of the present invention. To simplify the disclosure of the present invention, description of the components and arrangements of specific examples is given below. Of course, they are only illustrative and not intended to limit the present invention. Moreover, in the present invention, reference numbers and/or letters may be repeated in different embodiments. Such repetition is for the purposes of simplification and clearness, and does not denote the relationship between respective embodiments and/or arrangements being discussed. In addition, the present invention provides various examples for specific process and materials. However, it is obvious for a person of ordinary skill in the art that other process and/or materials may alternatively be utilized. Furthermore, the following structure in which a first object is "on" a second object may include an embodiment in which the first object and the second object are formed to be in direct contact with each other, and may also include an embodiment in which another object is formed between the first object and the second object such that the first and second objects might not be in direct contact with each other.

Figure 9:
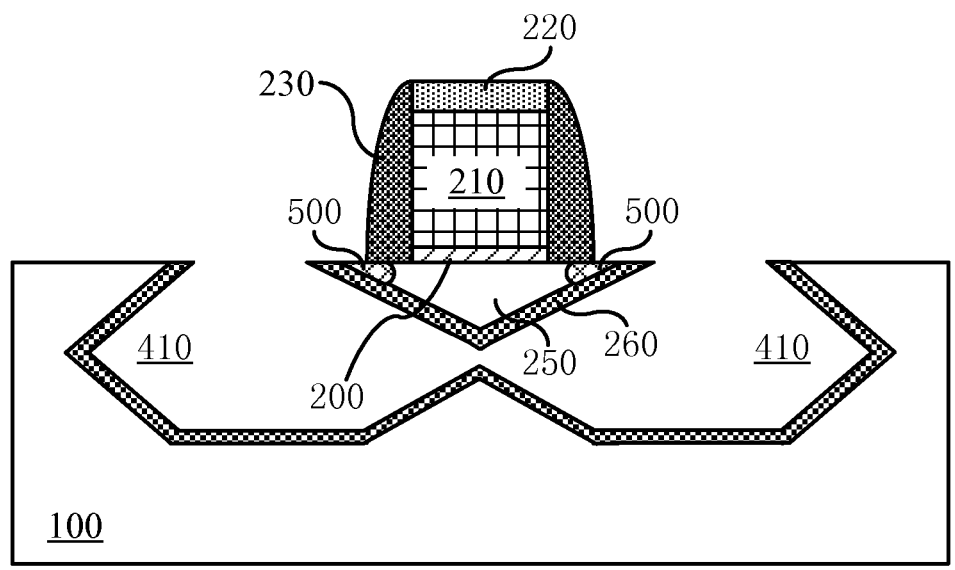

Now referring to FIG. 9, the semiconductor structure provided by the present invention will be described first. The semiconductor structure comprises a substrate 100, a semiconductor base 250, a semiconductor auxiliary base layer 260, a cavity 410, a gate stack, a sidewall spacer 230, and a source/drain region 500, wherein, the gate stack is located on the semiconductor base 250;

the sidewall spacer 230 is located on the sidewalls of the gate stack;

the source/drain region 500 is embedded into the semiconductor base 250 and is located on both sides of the gate stack;

the cavity 410 is embedded into the substrate 100;

the semiconductor base 250 is suspended above the cavity 410, and the thickness of the middle of the semiconductor base 250 is greater than the thickness of the two ends of the semiconductor base in the direction of the length of the gate, and the semiconductor base 250 is connected to the substrate in the direction of the width of the gate;

the semiconductor auxiliary base layer 260 is located on the sidewall of the semiconductor base 250 and has an opposite doping type to that of the source/drain region 500, and the doping concentration of the semiconductor auxiliary base layer 260 is higher than the doping concentration of the semiconductor base 250.

Preferably, the gate stack may comprise a gate dielectric layer 200 and a gate 210. Preferably, the gate stack may further comprise a covering layer 220 above the gate.

Preferably, the doping concentration of the semiconductor auxiliary base layer 260 is about $5 \times 10^{18}$-$5 \times 10^{19}$ cm$^{-3}$, and the thickness of the semiconductor auxiliary base layer is about 10-20 nm. With respect to a PMOS device, the doping type of the semiconductor auxiliary base layer 260 is a N type; and with respect to a NMOS device, the doping type of the semiconductor auxiliary base layer 260 is a P type.

The method for manufacturing the semiconductor structure will be described below.

Figure 1:
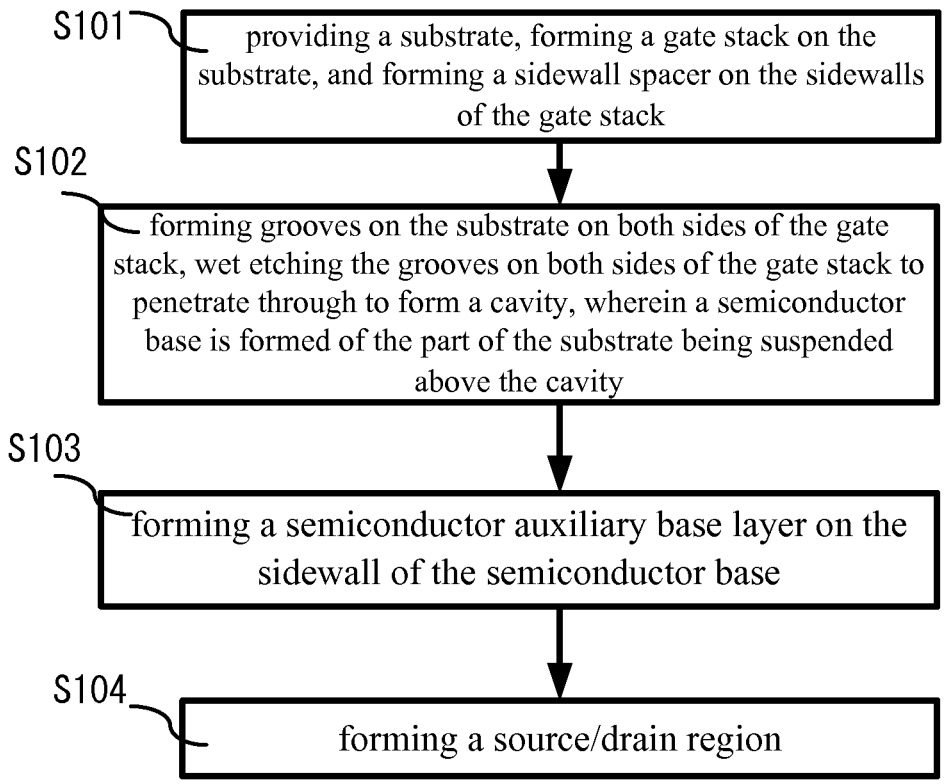
FIG. 1 is a flow chart of a specific embodiment of the method for manufacturing the semiconductor structure according to the present invention.

Referring to FIG. 1, the method comprises:

step S101, providing a substrate 100, forming a gate stack on the substrate 100 and forming a sidewall spacer 230 on the sidewalls of the gate stack;

step S102, forming grooves 400 on the substrate on both sides of the gate stack, wet etching the grooves 400 on both sides of the gate stack to penetrate through it so as to form a cavity 410, wherein a semiconductor base 250 is formed of the part of the substrate being suspended above the cavity 400;

step S103, forming a semiconductor auxiliary base layer 260 on the sidewall of the semiconductor base 250;

step S104, forming a source/drain region 500.

The steps S101 to S104 will be described below with reference to FIGS. 2-9. It shall be noted that the drawings for each of the embodiments of the present invention are only schematic, and thus are not drawn to scale.

Figure 2:
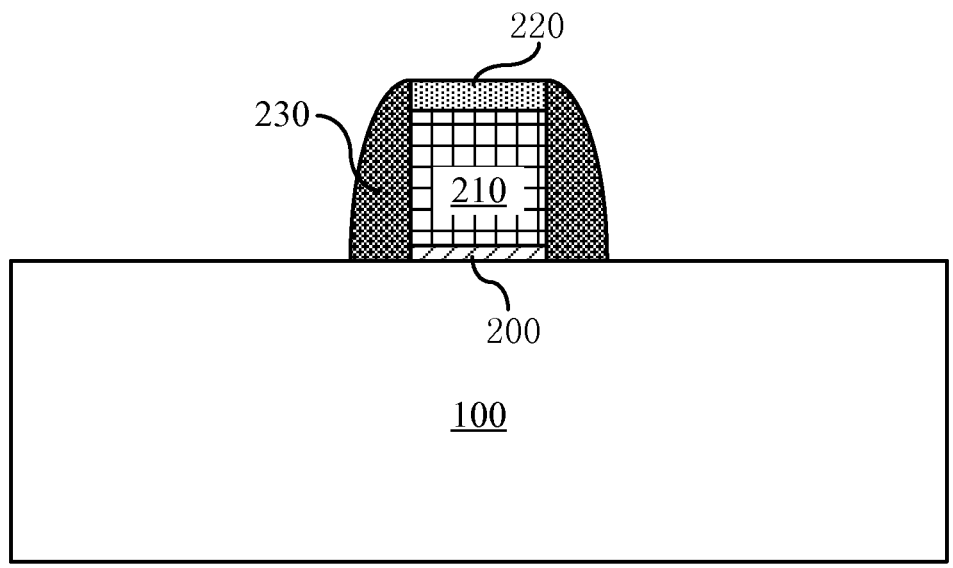
FIGS. 2-9 are schematic cross-sectional views of the various manufacturing stages of the semiconductor structure during the process for manufacturing the semiconductor structure according to the method shown in FIG. 1.

Referring to FIG. 2, in step S101, a substrate 100 is provided, and then a gate stack is formed on the substrate 100 and a sidewall spacer 230 is formed on the sidewalls of the gate stack. The gate stack comprises a gate dielectric layer 200 and a gate 210. Alternatively, the gate stack further comprises a covering layer 200 above the gate.

In this embodiment, the substrate 100 is monocrystalline silicon. Preferably, the crystal orientation of the substrate is {100}. According to design specifications known in the prior art (for example, a p-type substrate or a n-type substrate), the substrate 100 may comprise various kinds of doping configurations. In other embodiments, the substrate 100 may also include monocrystalline Ge or monocrystalline SiGe, or a combination thereof. Typically, the thickness of the substrate 100 may be, but not limited to, about several hundred microns. For example, the thickness may be within the range of about 400 μm-800 μm.

When the gate stack is formed, the gate dielectric layer 200 is first formed on the substrate 100. In this embodiment, the gate dielectric layer 200 may be silicon oxide or silicon nitride, or a combination thereof. In other embodiments, the gate dielectric layer 200 may also be a high-K dielectric, such as one of $HfO_2$, HfSiO, HfSiON, HfTaO, HfTiO, HfZrO, $Al_2O_3$, $La_2O_3$, $ZrO_2$ and LaAlO, or any combination thereof, and the thickness of the gate dielectric layer 200 may be about 1 nm-5 nm, for example, 2 nm or 4 nm. The gate 210 may be a heavily doped polysilicon that is formed by deposition, or the gate 210 may be formed by first forming a work function metal layer (for example, TaC, TiN, TaTbN, TaErN, TaYbN, TaSiN, HfSiN, MoSiN, $RuTa_x$, $NiTa_x$ and the like with respect to a NMOS device, and for example, $MoN_x$, TiSiN, TiCN, TaAlC, TiAlN, TaN, $PtSi_x$, $Ni_3Si$, Pt, Ru, Ir, Mo, HfRu, $RuO_x$ and the like with respect to a PMOS device), the thickness of which is about 1 nm-20 nm, for example, 3 nm, 5 nm, 8 nm, 10 nm, 12 nm or 15 nm, then forming a material selected from the group consisting of a heavily doped polysilicon, Ti, Co, Ni, Al and W, or an alloy thereof on the work function metal layer. Finally, a covering layer 220 is formed on the gate 210, for example, by depositing one of silicon nitride, silicon oxide, silicon oxynitride and silicon carbide, or any combination thereof so as to protect the top area of the gate 210.

Next, a sidewall spacer 230 is formed on the sidewalls of the gate stack for isolating and protecting the gate. The sidewall spacer 230 may be formed of one of silicon nitride, silicon oxide, silicon oxynitride and silicon carbide, or any combination thereof, and/or of other appropriate materials, and may have a multi-layered structure. The sidewall spacer 230 may be formed by a process including deposition and etching, and the thickness of the sidewall spacer is within the range of about 10 nm-100 nm, for example, 30 nm, 50 nm or 80 nm.

Figure 3:
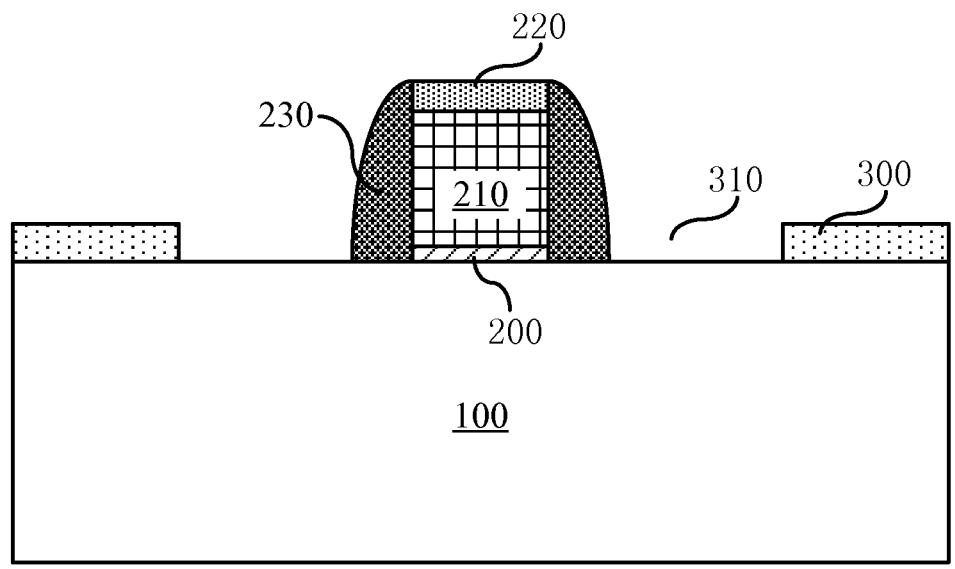
Figure 4:
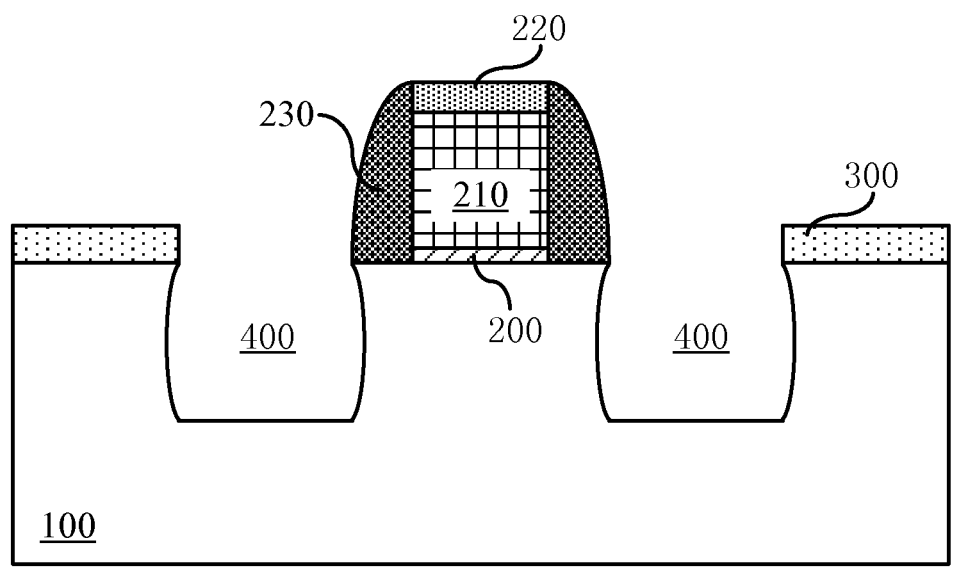
Figure 5:
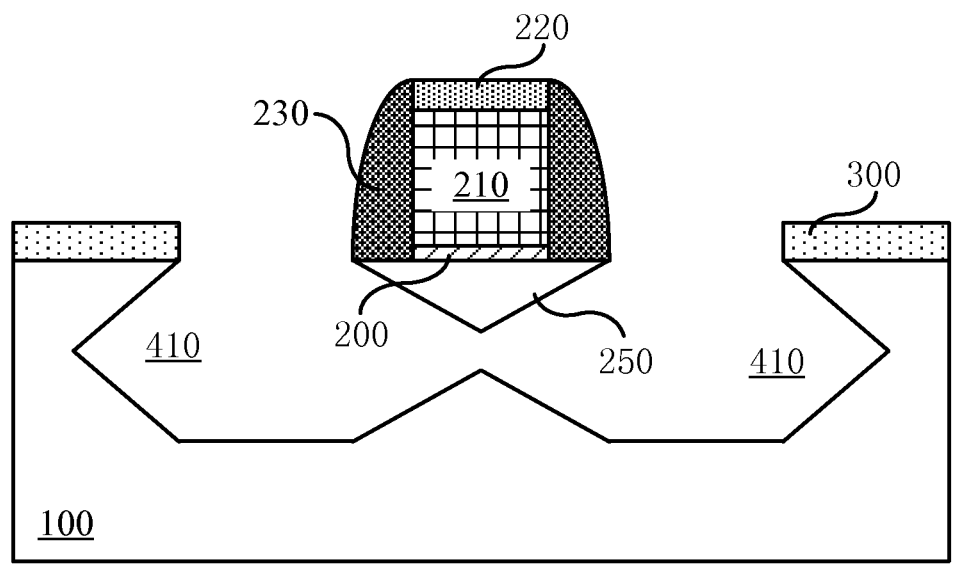

Referring to FIGS. 3, 4 and 5, in step S102, grooves 400 are formed on the substrate on both sides of the gate stack. The grooves 400 on both sides of the gate stack are wet etched to be penetrated through so as to form a cavity 410. The semiconductor base 250 is formed of the part of the substrate crossing over the cavity 400.

First, grooves 400 are formed on the substrate 100. The specific procedure for forming the grooves 400 is described as follows. A mask layer 300 is formed on the substrate 100 and the gate stack, and covered with a layer of photoresist (not shown in the figure). Openings are formed on the photoresist by exposure and developing, and located on both sides of the gate stack. The mask layer 300 in the openings is etched to form an opening 310 on the mask layer. Then the photoresist is removed. As shown in FIG. 3, in this embodiment, one side of the opening 310 is connected to the sidewall spacer 230. In some other embodiments of the present invention, a part of the mask layer 300 may be disposed between the opening 310 and the sidewall spacer 230, which may be reasonably arranged according to the size and the like of the semiconductor device to be designed. Then, the substrate 100 is etched to form grooves 400 on both sides of the gate stack, as shown in FIG. 4. The material of the mask layer 300 is one of silicon oxide, silicon nitride and silicon oxynitride, or any combination thereof. The material of the mask layer 300 may be formed on the substrate by an appropriate process like chemical vapor deposition. The process for etching the mask layer may include dry etching RIE or wet etching using a suitable etching liquid. The thickness of the mask layer may be controlled to be within the range of about 1-5 μm according to the design requirement. The process for etching the substrate to form grooves 400 may be dry etching RIE, in which a steep sidewall can be obtained by adjusting and controlling the gas flow, component, power consumption, etc. of the RIE device, or the transverse underetching can be made to increase as desired. In this embodiment, the grooves 400 which are obtained by dry etching has an almost steep sidewall, and in the subsequent wet etching, the grooves 400 on both sides of the gate stack are punched through between each other by means of the anisotropy of the wet etching. In some other embodiments of the present invention, the degree of transverse underetching of the grooves 400 can be increased by adjusting the process parameters of the dry RIE, thus facilitating punching through the grooves 400 in the subsequent steps.

Figure 6:
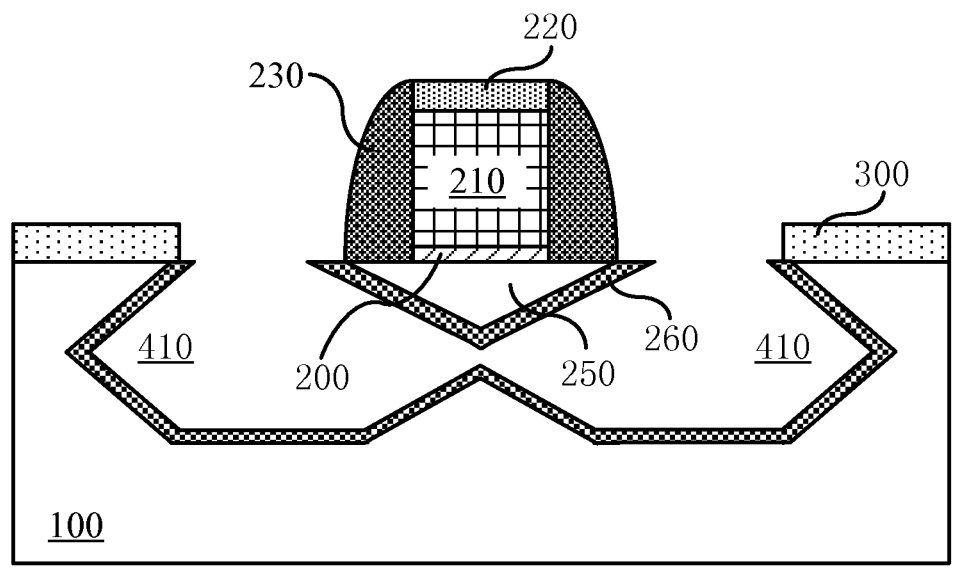

As shown in FIG. 5, after forming the grooves 400 in the substrate on both sides of the gate stack, the grooves 400 are continuously etched by means of a wet etching technique, so that the grooves on both sides of the gate stack are punched through to form a cavity 410. The semiconductor base 250 is formed of the part of the substrate crossing over the cavity in a suspended manner. In the subsequent process steps, the source/drain region may be formed in the semiconductor base 250, meanwhile, the semiconductor base 250 may also act as the channel region of the semiconductor device. The two ends of the semiconductor base are connected to the substrate 100 in the direction in the gate width. In this embodiment, the crystal orientation of the substrate may be {100}, and the etching liquid used for wet etching may be one of potassium hydroxide (KOH), tetra methyl ammonium hydroxide (TMAH), quadrol-pyrocatechol (EDP) and the like, or any combination thereof, and the concentration of the etching liquid may be about 5-40% by mass, and the reaction temperature in the wet etching may be about 40° C.-90° C. Since the etching of the monocrystalline silicon by an etching liquid such as KOH and TMAH is anisotropic, a ratio between the etching rate on the crystal face {111} and the etching rate on other crystal faces is about 1:100, thus the crystal face {111} is substantially not etched. As shown in FIG. 5, the sidewalls of the cavity 400 are all etch-stop surfaces, the crystal face of which is each {111}. The groove structure is punched through by means of the anisotropic etching Step S103 is performed to form a semiconductor auxiliary base layer 260 on the sidewall of the semiconductor base 250. Referring to FIG. 6, the semiconductor auxiliary base layer 260 is formed on the sidewall of the semiconductor base 250 and the surface of the cavity 400 by means of in-situ doping epitaxy. The semiconductor auxiliary base layer 260 has a doping type opposite to the type of the device to be formed. With respect to a PMOS device, the doping type of the semiconductor auxiliary base layer 260 is a N type; and with respect to a NMOS device, the doping type of the semiconductor auxiliary base layer 260 is a P type. While the semiconductor auxiliary base layer 260 is epitaxially grown, an in-situ doping is performed synchronously, so that the doping concentration of the semiconductor auxiliary base layer 260 is higher than that of the semiconductor base 250, thereby reducing the thickness of the source/drain region depletion layer and effectively reducing the short channel effect. The doping concentration of the semiconductor auxiliary base layer 260 is about $5\times10^{18}$-$5\times10^{19}$ cm$^{-3}$, and the thickness of the semiconductor auxiliary base layer 260 is about 10-20 nm. The specific process parameters of the in-situ doping epitaxial growth, such as the process temperature, reaction time and doping particles, may be flexibly adjusted according to the design requirements of the product, which will not be repeated here any more.

Figure 7:
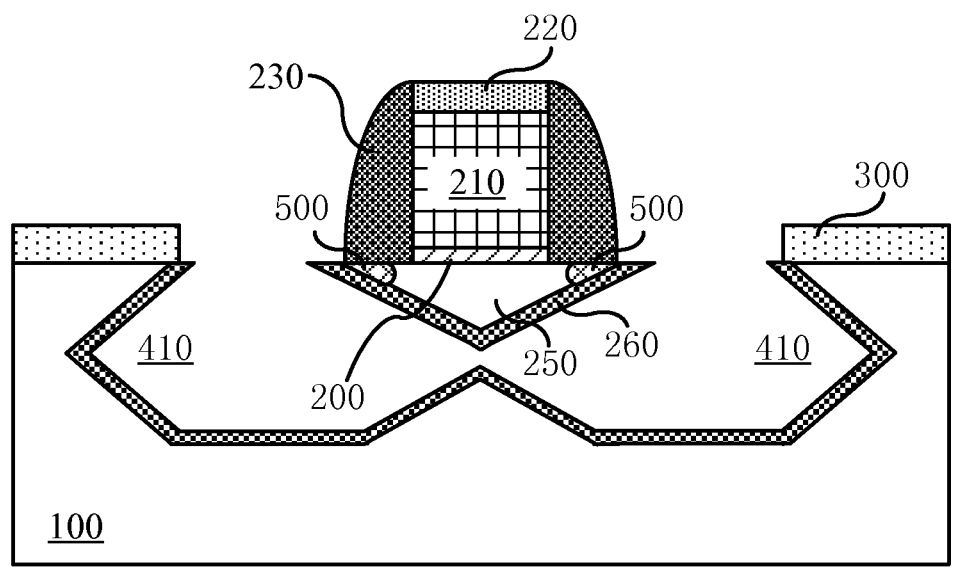

Referring to FIG. 7, step S104 is performed to form a source/drain region 500. The process for forming the source/drain region 500 may use one of ion implantation, diffusion and in-situ doping epitaxy, or any combination thereof. With respect to a PMOS device, the source/drain region 500 may be a P-type doping, and with respect to a NMOS device, the source/drain region 500 may be a N-type doping. Then the semiconductor structure is annealed to activate the dopant in the source/drain region 500. The annealing may includes short annealing, spike annealing and other appropriate annealing techniques.

Figure 8:
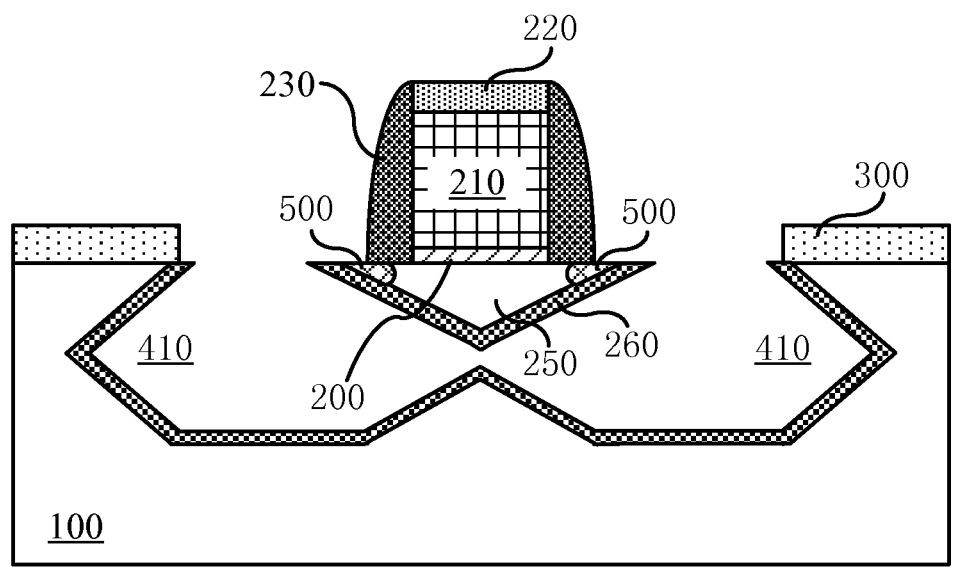

In some other embodiments of the present invention, the source/drain contact area can be enlarged by etching a part of the sidewall spacer 230 before the source/drain region 500 is formed, then the ion implantation or doping is performed to form the source/drain region 500, as shown in FIG. 8. Subsequently, the mask layer 300 is removed, as shown in FIG. 9. An insulating material (not shown in the figure) may be filled into the cavity 400 according to the specific device design. After the completion of the manufacturing of the semiconductor structure, an interlayer dielectric layer is necessarily formed on the entire semiconductor structure, and thus certainly enters into the cavity 410, so the substance of the present invention will not be influenced by the fact whether the cavity 410 is filled with a dielectric or not.

Although the exemplary embodiments and the advantages thereof have been described in detail, it shall be understood that various changes, substitutions and modifications can be made to these embodiments without departing from the spirit of the present invention and the protection scope defined by the attached claims. As for other examples, it shall be easily understood by those skilled in the art that the sequences of the process steps can be changed within the protection scope of the present invention.

In addition, the scope to which the present invention is applied is not limited to the process, mechanism, manufacture, material composition, means, methods and steps described in the specific embodiments in the specification. Those skilled in the art would readily appreciate from the disclosure of the present invention that the process, mechanism, manufacture, material composition, means, methods and steps currently existing or to be developed in future, which perform substantially the same functions or achieve substantially the same as that in the corresponding embodiments described in the present invention, may be applied according to the present invention. Therefore, it is intended that the scope of the appended claims of the present invention includes these process, mechanism, manufacture, material composition, means, methods, or steps.

What is claimed is:

1. A method for manufacturing a semiconductor structure, comprising:
   (a) providing a substrate, forming a gate stack on the substrate, and forming a sidewall spacer on the sidewalls of the gate stack;
   (b) forming grooves on the substrate on both sides of the gate stack, wet etching the grooves on both sides of the gate stack to penetrate through to form a cavity, wherein a semiconductor base is formed of the part of the substrate being suspended above the cavity;
   (c) forming a semiconductor auxiliary base layer on the sidewall of the semiconductor base; and
   (d) forming a source/drain region.

2. The method according to claim 1, wherein the substrate is made of monocrystalline Si, monocrystalline Ge and monocrystalline SiGe, or any combination thereof.

3. The method according to claim 1, wherein the crystal orientation of the substrate is <100>.

4. The method according to claim 1, wherein forming the grooves in the step (b) comprising:
   forming a mask layer on the substrate and the gate stack;
   covering the mask layer with a layer of photoresist and forming openings on the photoresist by the exposure and development, wherein said openings are located on both sides of the gate stack;
   etching the mask layer in said openings and removing the photoresist; and
   etching the substrate to form grooves on both sides of the gate stack.

5. The method according to claim 4, wherein the etching of the substrate to form the grooves is performed by using dry etching.

6. The method according to claim 1, wherein in step (b), the etching liquid used for the wet etching includes one of potassium hydroxide (KOH), tetra methyl ammonium hydroxide (TMAH) and quadrol-pyrocatechol (EDP), or any combination thereof.

7. The method according to claim 6, wherein the concentration of the etching liquid is about 5-40% by mass, and the reaction temperature in the wet etching is about 40° C.-90° C.

8. The method according to claim 1, wherein
   with respect to a PMOS device, the doping type of the semiconductor auxiliary base layer is a N type; and
   with respect to a NMOS device, the doping type of the semiconductor auxiliary base layer is a P type.

9. The method according to claim 8, wherein the doping concentration of the semiconductor auxiliary base layer is about $5\times10^{18}$-$5\times10^{19}$ cm$^{-3}$, and the thickness of the semiconductor auxiliary base layer is about 10-20 nm.

10. The method according to claim 6, wherein in step (c), the semiconductor auxiliary base layer is formed by means of in-situ doping epitaxy.

* * * * *